United States Patent [19]

de Couasnon et al.

[11] Patent Number: 5,329,552
[45] Date of Patent: Jul. 12, 1994

[54] METHOD OF BINARY ENCODING THE POINTS OF A CONSTELLATION USED IN A MULTICARRIER MODULATION OF OFDM TYPE

[75] Inventors: Tristan de Couasnon, Rennes; Raoul Monnier, Noyal sur Vilaine; Yvon Fouche, Chatenay Malabry; Jean-Bernard Rault, Acigne, all of France

[73] Assignee: Thomson-CSF, Puteaux, France

[21] Appl. No.: 941,057

[22] PCT Filed: Feb. 11, 1992

[86] PCT No.: PCT/FR92/00117
§ 371 Date: Oct. 13, 1992
§ 102(e) Date: Oct. 13, 1992

[87] PCT Pub. No.: WO92/14315
PCT Pub. Date: Aug. 20, 1992

[30] Foreign Application Priority Data

Feb. 12, 1991 [FR] France ................. 91 01584

[51] Int. Cl.⁵ ............... H04L 27/04; H04L 27/12; H04L 27/20
[52] U.S. Cl. ....................................... 375/59
[58] Field of Search .............. 375/38, 39, 40, 42, 375/8, 59, 1; 371/378, 68.1, 68.2, 43; 370/69.1

[56] References Cited

U.S. PATENT DOCUMENTS 3,887,768  6/1975  Forney, Jr. et al. ............. 375/42
3,988,539  10/1976  Motley et al. .
4,480,897  12/1990  Dukes et al. ..................... 371/43
4,866,395  9/1989  Hostetter ......................... 375/39
4,924,516  5/1990  Bremer et al. .
5,214,656  5/1993  Chung et al. ................... 371/43

FOREIGN PATENT DOCUMENTS 0200505  12/1986  European Pat. Off. .
2103456  2/1983  United Kingdom .

OTHER PUBLICATIONS

Bingham, J. C., "Multicarrier Modulation for Data Transmission: An Idea Whose Time Has Come," May 1990, IEEE Communication Magazine, pp. 5–14.

Primary Examiner—Stephen Chin
Assistant Examiner—Duane Kobayashi
Attorney, Agent, or Firm—Oblon, Spivak, McClelland, Maier & Neustadt

[57] ABSTRACT

The present invention relates to a method of binary encoding the N points of a constellation corresponding to the discrete positions, in amplitude and in phase, associated with the encoding of binary words in the case of a multicarrier modulation of OFDM type (Orthogonal Frequency Division Multiplexing) of a digitized signal. According to the method, two adjacent points of the constellation correspond to binary words which differ from one another by at most two bits. The present invention applies in particular to digital television.

3 Claims, 6 Drawing Sheets

| | | | | | | | | |
|---|---|---|---|---|---|---|---|---|
| 32<br>+<br>100000 | 33<br>+<br>100001 | 41<br>+<br>101001 | 40<br>+<br>101000 | 56<br>+<br>111000 | 57<br>+<br>111001 | 49<br>+<br>110001 | 48<br>+<br>110000 | 7 |
| 34<br>+<br>100010 | 35<br>+<br>100011 | 43<br>+<br>101011 | 42<br>+<br>101010 | 58<br>+<br>111010 | 59<br>+<br>111011 | 51<br>+<br>110011 | 50<br>+<br>110010 | 5 |
| 38<br>+<br>100110 | 39<br>+<br>100111 | 47<br>+<br>101111 | 46<br>+<br>101110 | 62<br>+<br>111110 | 63<br>+<br>111111 | 55<br>+<br>110111 | 54<br>+<br>110110 | 3 |
| 36<br>+<br>100100 | 37<br>+<br>100101 | 45<br>+<br>101101 | 44<br>+<br>101100 | 60<br>+<br>111100 | 61<br>+<br>111101 | 53<br>+<br>110101 | 52<br>+<br>110100 | 1 |
| 4<br>+<br>000100 | 5<br>+<br>000101 | 13<br>+<br>001101 | 12<br>+<br>001100 | 28<br>+<br>011100 | 29<br>+<br>011101 | 21<br>+<br>010101 | 20<br>+<br>010100 | −1 |
| 6<br>+<br>000110 | 7<br>+<br>000111 | 15<br>+<br>001111 | 14<br>+<br>001110 | 30<br>+<br>011110 | 31<br>+<br>011111 | 23<br>+<br>010111 | 22<br>+<br>010110 | −3 |
| 2<br>+<br>000010 | 3<br>+<br>000011 | 11<br>+<br>001011 | 10<br>+<br>001010 | 26<br>+<br>011010 | 27<br>+<br>011011 | 19<br>+<br>010011 | 18<br>+<br>010010 | −5 |
| 0<br>+<br>000000 | 1<br>+<br>000001 | 9<br>+<br>001001 | 8<br>+<br>001000 | 24<br>+<br>011000 | 25<br>+<br>011001 | 17<br>+<br>010001 | 16<br>+<br>010000 | −7 |
| −7 | −5 | −3 | −1 | 1 | 3 | 5 | 7 | |

FIG. 3

|  |  |  |  |  |  |  |  |
|---|---|---|---|---|---|---|---|
| 48<br>+ | 50<br>+ | 54<br>+ | 52<br>+ | 20<br>+ | 22<br>+ | 18<br>+ | 16<br>+ |
| 49<br>+ | 51<br>+ | 55<br>+ | 53<br>+ | 21<br>+ | 23<br>+ | 19<br>+ | 17<br>+ |
| 57<br>+ | 59<br>+ | 63<br>+ | 61<br>+ | 29<br>+ | 31<br>+ | 27<br>+ | 25<br>+ |
| 56<br>+ | 58<br>+ | 62<br>+ | 60<br>+ | 28<br>+ | 30<br>+ | 26<br>+ | 24<br>+ |
| 40<br>+ | 42<br>+ | 46<br>+ | 44<br>+ | 12<br>+ | 11<br>+ | 10<br>+ | 8<br>+ |
| 41<br>+ | 43<br>+ | 47<br>+ | 45<br>+ | 13<br>+ | 15<br>+ | 11<br>+ | 9<br>+ |
| 33<br>+ | 35<br>+ | 39<br>+ | 37<br>+ | 5<br>+ | 7<br>+ | 3<br>+ | 1<br>+ |
| 32<br>+ | 34<br>+ | 38<br>+ | 36<br>+ | 4<br>+ | 6<br>+ | 2<br>+ | 0<br>+ |

FIG. 4

| | | | | | | | |
|---|---|---|---|---|---|---|---|
| 36 + | 37 + | 45 + | 44 + | 60 + | 61 + | 53 + | 52 + |
| 38 + | 39 + | 47 + | 46 + | 62 + | 63 + | 55 + | 54 + |
| 34 + | 35 + | 43 + | 42 + | 58 + | 59 + | 51 + | 50 + |
| 32 + | 33 + | 41 + | 40 + | 56 + | 57 + | 49 + | 48 + |
| 0 + | 1 + | 9 + | 8 + | 24 + | 25 + | 17 + | 16 + |
| 2 + | 3 + | 11 + | 10 + | 26 + | 27 + | 19 + | 18 + |
| 6 + | 7 + | 15 + | 14 + | 30 + | 31 + | 23 + | 22 + |
| 4 + | 5 + | 13 + | 12 + | 28 + | 29 + | 21 + | 20 + |

FIG. 5

|  |  |  |  |  |  |  |  |
|---|---|---|---|---|---|---|---|
| 20+ | 21+ | 29+ | 28+ | 12+ | 13+ | 5+ | 4+ |
| 22+ | 23+ | 31+ | 30+ | 14+ | 15+ | 7+ | 6+ |
| 18+ | 19+ | 27+ | 26+ | 10+ | 11+ | 3+ | 2+ |
| 16+ | 17+ | 25+ | 24+ | 8+ | 9+ | 1+ | 0+ |
| 48+ | 49+ | 57+ | 56+ | 40+ | 41+ | 33+ | 32+ |
| 50+ | 51+ | 59+ | 58+ | 42+ | 43+ | 35+ | 34+ |
| 54+ | 55+ | 63+ | 62+ | 46+ | 47+ | 39+ | 38+ |
| 52+ | 53+ | 61+ | 60+ | 44+ | 45+ | 37+ | 36+ |

FIG.6

METHOD OF BINARY ENCODING THE POINTS OF A CONSTELLATION USED IN A MULTICARRIER MODULATION OF OFDM TYPE

FIELD OF THE INVENTION

The present invention relates to a method of binary encoding the N points of a constellation corresponding to the discrete positions, in amplitude and in phase, associated with the encoding of digital words in the case of a multicarrier modulation of OFDM type (Orthogonal Frequency Division Multiplexing) of a digitized signal. It also relates to a method of assigning a constellation to a channel, especially when the points of the constellation are encoded by the method in accordance with the present invention.

BACKGROUND OF THE INVENTION

In international patent application PCT/FR 89/00546, filed in the name of THOMSON-CSF, an especially powerful method of transmission has been described which uses a multicarrier modulation of OFDM type enabling a digitized signal to be transmitted with a high density. In the method of transmission described, a plurality of orthogonal frequencies are used and a pair (amplitude-phase) or (real part, imaginary part) is transmitted on each frequency, the amplitude-phase or real part-imaginary part pair being the one-to-one equivalent of the item of information to be forwarded. In order to produce the above one-to-one function, use is made of a constellation in a known manner. Indeed, each sub-carrier constituting the signal is modulated in amplitude and in phase in a discrete manner and the discrete positions, in amplitude and in phase, constitute a constellation in the complex plane. Several types of constellation can be used. Thus, in international patent application PCT/FR 89/00546 a circular constellation has been proposed. In this case, the amplitude-phase pairs corresponding to each digital word are distributed uniformly over concentric circles. The transcoding between the binary words of the digitized signal and a point of the constellation can be done in many ways without using any especially simple relationship. However, it is important for this encoding to make it possible to avoid, during reception, the maximum number of errors at the signal recovery level.

Thus, the aim of the present invention is to offer a novel method of binary encoding the points of a constellation which makes it possible to limit the number of errors during decoding.

SUMMARY OF THE INVENTION

Accordingly, the subject of the present invention is a method of binary encoding the N points of a constellation corresponding to the discrete positions, in amplitude and in phase, associated with the encoding of binary words in the case of a multicarrier modulation of OFDM type (Orthogonal Frequency Division Multiplexing) of a digitized signal, characterized in that two adjacent points of the constellation correspond to binary words which differ from one another by at most two bits.

According to a special embodiment applicable in particular when the points of the constellation are distributed over nested quadrilaterals, two horizontally and vertically adjacent points of the constellation correspond to binary words which differ from one another by a single bit, whereas two diagonally adjacent points of the constellation correspond to binary words which differ from one another by two bits.

Furthermore, in the case of a multicarrier modulation of OFDM type, if a single constellation is used for the all the channels, when all the carriers have maximum amplitude and are in phase, the transmitter must then pass a very high power spike with the risk of saturating this transmitter and thus of distorting the signal. This phenomenon occurs if no precaution is taken to avoid lengthy strings of "0"s or "1"s at the input of the device.

The aim of the present invention is also to provide a method of assigning a constellation to a channel which makes it possible to avoid the above disadvantages.

Accordingly, the subject of the present invention is a method of assigning a constellation to a channel, characterized in that a different constellation chosen from M constellations is assigned to each channel randomly in such a way as to avoid the phase-summation of signals.

Preferably, the M constellations contain points encoded according to the binary encoding method described above.

BRIEF DESCRIPTION OF THE DRAWINGS

Other characteristics and advantages of the present invention will emerge on reading the following description of various embodiments, this description being given with reference to the attached drawings in which:

FIGS. 3 to 6 are diagrams representing various encodings in accordance with the present invention.

DETAILED DESCRIPTION OF THE PREFERRED EMBODIMENT

Figure 1:
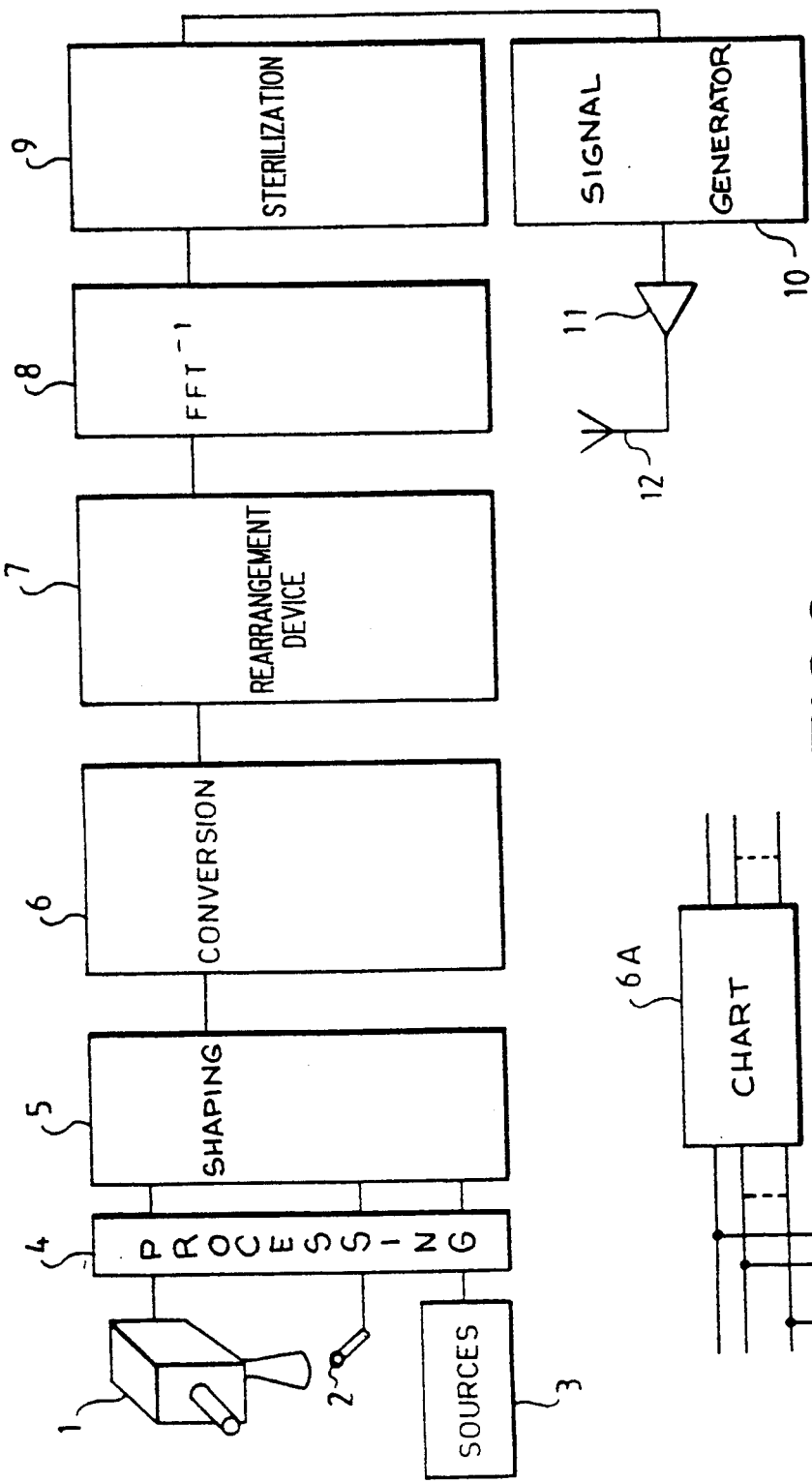
FIG. 1 is a simplified block diagram of a transmitter to which the present invention can be applied.

In FIG. 1 there is represented a block diagram of a transmitter which uses constellations encoded by the binary encoding method in accordance with the present invention. This transmitter makes it possible to transmit modulated waves according to the principle described in international patent application PCT/FR 89/00546.

In the example illustrated in FIG. 1 the signal to be transmitted is provided either by a television camera 1, a microphone 2 and/or other sources 3. Advantageously, the sources 1, 2 and/or 3 are linked to an information processing device 4 making it possible to carry out a certain number of modifications such as a reduction in information throughput, for example by eliminating redundant information. Moreover, the processing device 4 can include a signal scrambling device of known type. The processing device 4 is connected to a shaping circuit 5 which carries out the desired shaping of the signals arising from the sources 1 to 3. For example, the shaping circuit 5 carries out the multiplexing of the various sources and provides digital words in series. In a known manner, the shaping circuit includes sampling circuits, analog-to-digital converters and/or multiplexers. The digital signals output by the shaping circuit are conveyed to a conversion circuit 6 which converts the digital signals at input into complex signals. This conversion circuit 6 therefore includes in a known manner one or more constellations as described in Patent Application PCT/FR 89/00546.

Figure 2:
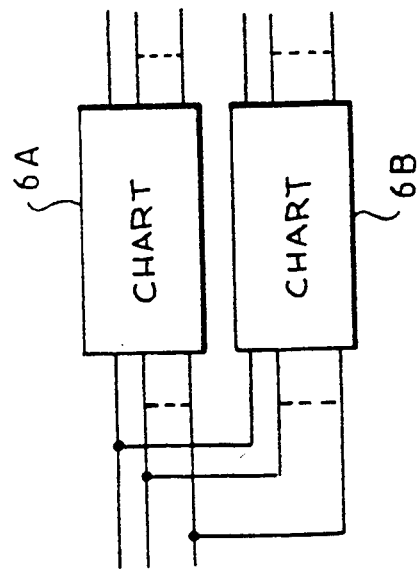
FIG. 2 is a more detailed block diagram of part of the transmitter of FIG. 1.
Figure 7:
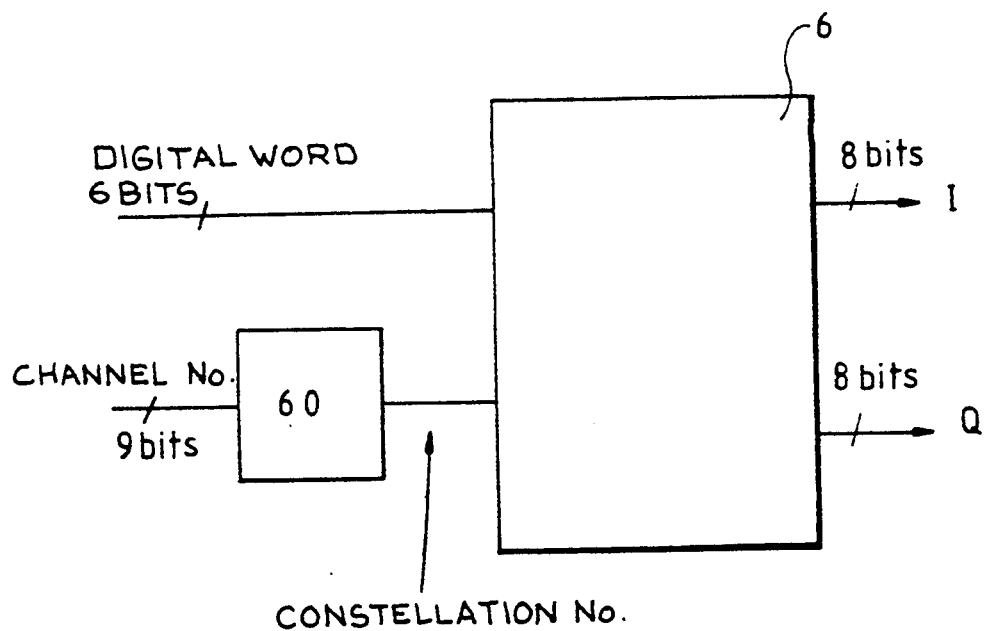
FIG. 7 is a simplified block diagram of an element of the transmitter permitting the assigning of a channel according to the present invention.

As represented in FIG. 2, the circuit 6 for converting digital words into complex signals can include two conversion charts 6a, 6b forming a constellation stored in memory circuits. For storing the constellations use is made for example of permanent memories such as read-only memories, programmable memories, erasable programmable read-only memories, electrically erasable programmable read-only memories or secure random-access memories (ROM, PROM and EE.PROM or RAM). The digital words to be converted correspond to the addresses in the charts, the value of the amplitude or real part of the signal being stored at this address in a first chart 6a and the value of the phase or imaginary part of the signal being stored in the second chart 6b, for example. The values stored in the charts therefore correspond to a constellation in the embodiment represented, it being possible for this constellation to be encoded in various ways, as will be explained in more detail below. Moreover, the conversion circuit 6 is connected to a rearrangement device 7 whose role is to format the data to be processed so as to be compatible with the computation device, i.e. with the circuits 8 used for inverse fast Fourier transform computation. The output from the circuit for inverse Fourier transform computation ($FFT^{-1}$) 8 is connected to a signal serializing device 9. The serializing circuit 9 is connected to a generator 10 of the signal to be transmitted, itself connected to an amplifier 11 which transmits the signal via an antenna 12. For a more detailed description of the various circuits of the transmitter reference may be made to Patent Application PCT/FR 89/00546.

As mentioned above, the various points of a constellation enabling the digital words at input to be transformed into complex signals, i.e. yielding amplitude/phase or real part/imaginary part pairs at output, are stored in the memories of the conversion circuit 6. These constellations are used in the case of the transmission of a digitized signal modulated using multicarrier modulation of OFDM type (Orthogonal Frequency Division Multiplexing). To avoid the maximum number of errors during reception of the wave modulated according to this type of modulation, a special binary encoding of the N points of the constellation is proposed in accordance with the present invention. In accordance with this encoding method, two adjacent points of the constellation correspond to binary words which differ from one another by at most two bits. This type of encoding will be illustrated with reference to FIGS. 3 to 6 which correspond to four different constellations using the same encoding principle.

In FIGS. 3 to 6 are represented a square constellation containing 64 points. However, it is clear to the expert that the present invention can be applied to other types of constellation, in particular constellations in which the points are distributed over concentric circles or over nested quadrilaterals such as squares or rectangles. Furthermore, the number of points is not limiting. It has been chosen so as to simplify hardware construction. Indeed, the number of points making up a constellation has a direct influence on the throughput of the pathway and is chosen as a function of the signal-to-noise ratio and of the distortion characteristic of the pathway.

Moreover, the digital words at input are encoded on 6 bits, this encoding corresponding to the number of points of the constellation, i.e. 64. Thus, as represented in FIG. 1 [sic] and in accordance with the present invention, the binary word 0 encoded into "000000" is placed at the vertex of the outer square of the constellation. The other 63 points are coded as follows: the horizontally and vertically adjacent words correspond to binary words which differ from one another by a single bit. Thus, word 1 corresponding to the encoding "000001" has been placed on the same horizontal line as word 0, and word 2 corresponding to the encoding "000010" has been placed on the same vertical line as word 0. Similarly, on the same horizontal line, word 1 is followed by word 9 corresponding to the encoding "001001" whereas on the same vertical line, word 2 is followed by word 6 corresponding to the encoding "000110" and so on as represented in FIG. 3.

Moreover, in accordance with the present invention, two diagonally adjacent points of the constellation correspond to binary words which differ from one another by two bits. Accordingly, on the diagonal, binary word 0 is followed by word 3 corresponding to the encoding "000011", itself followed by word 15 corresponding to the encoding "001111". Accordingly a type of encoding corresponding to the present invention is represented in FIG. 3. Other types of encoding corresponding to the same criteria can be used, in particular the encoding represented in FIG. 4 which arises out of the encoding of FIG. 3 by a 90° rotation with respect to the center of the constellation. Similarly, the encoding of FIG. 5 in which word 0 is now placed not on a vertex of the outer square but close to the central line. Another type of encoding is that represented in FIG. 6 which derives from that of FIG. 5 by a 180° rotation. In fact, various constellations can be obtained from the constellation represented in FIG. 3 by simple transformations such as rotations or symmetries.

The present invention also relates to a method of assigning a constellation to a channel. Indeed, in the method of transmitting a signal using an OFDM modulated wave, a significant number of mutually orthogonal channels are used. The modulation is carried out by assigning to each channel an amplitude and a phase which are drawn from the points of a constellation as a function of the data to be forwarded, and then an inverse Fourier transformation is next performed on the chart of points generated in the preceding step. To avoid a continuous string of "0"s or "1"s from bringing about a phase-summation of carriers of maximum amplitude, it is necessary to be able to lay out the points of the constellations randomly from one channel to the next. Therefore, in accordance with the present invention, a constellation is assigned to each channel, by random drawing from a finite number of constellations satisfying the adjacency properties of the points, in such a way as to avoid the phase-summation of the signals. Thereby, the transcoding of the digital word at a point of the constellation becomes a function which is known to the transmitter and to the receiver of the channel number. To carry this out, use is made of several constellations. It is for example possible to use eight constellations arising from the constellations represented in FIGS. 3 to 6 and one constellation from the eight constellations stored in the memory or memories of the conversion circuit 6 is assigned to the P channels, i.e. for example to the 512 channels used in the embodiment of the present invention, by random drawing, this assigning being carried out once and for all. For this purpose the channel number coded on 9 bits in a memory 60 correlating the channel number with a constellation number towards which the digital words at input coded on 6 bits will be conveyed is input into the conversion circuit in order to transform these bits into a complex word I,Q, each element of which is encoded on 8 bits in a known manner. Therefore, an assignment table specified once and for all, and in which there is no risk of saturating some links of the transmission chain, is therefore used in the transmitter and receiver devices for implementing the method.

It will advantageously be possible to compute the contents of the memory 60 from random drawings by a Monte Carlo type procedure.

We claim:

1. A method of binary encoding the N points of a constellation corresponding to the discrete positions in amplitude and in phase, associated with the encoding of binary words of a digital signal in a multicarrier modulation of OFDM type (Orthogonal Frequency Division Multiplexing) consisting in assigning to each channel of the multicarrier modulation a constellation of N points, by random drawing from a finite number of predetermined constellations, wherein said assigning is carried out only once, and assigning to each two adjacent points of each predetermined constellation binary words which differ from one another by at most two bits.

2. Method according to claim 1, characterized in that the points of the constellation are distributed over concentric circles or nested quadrilaterals.

3. Method according to either one of claims 2 and 6 characterized in that two horizontally and vertically adjacent points of the constellation corresponding to binary words which differ from one another by a single bit, whereas two diagonally adjacent points of the constellation correspond to binary words which differ from one another by two bits.

* * * * *

UNITED STATES PATENT AND TRADEMARK OFFICE
CERTIFICATE OF CORRECTION

PATENT NO. : 5,329,552
DATED : July 12, 1994
INVENTOR(S) : Tristan DE COUASNON, et al.

It is certified that error appears in the above-indentified patent and that said Letters Patent is hereby corrected as shown below:

On the title page, Item [87], the PCT Publication Number should read as follows:

--WO92/14316--

Signed and Sealed this

Eleventh Day of October, 1994

Attest:

BRUCE LEHMAN

*Attesting Officer*  *Commissioner of Patents and Trademarks*